(12) United States Patent
DeSouza et al.

(10) Patent No.: US 7,772,096 B2
(45) Date of Patent: Aug. 10, 2010

(54) FORMATION OF SOI BY OXIDATION OF SILICON WITH ENGINEERED POROSITY GRADIENT

(75) Inventors: Joel P. DeSouza, Putnam Valley, NY (US); Keith E. Fogel, Hopewell Junction, NY (US); Alexander Reznicek, Slingerlands, NY (US); Devendra Sadana, Pleasantville, NY (US)

(73) Assignee: International Machines Corporation, Armonk, NY (US)

( * ) Notice: Subject to any disclaimer, the term of this patent is extended or adjusted under 35 U.S.C. 154(b) by 0 days.

(21) Appl. No.: 12/170,459

(22) Filed: Jul. 10, 2008

(65) Prior Publication Data

US 2010/0006985 A1    Jan. 14, 2010

(51) Int. Cl.
*H01L 21/20* (2006.01)
*H01L 21/36* (2006.01)

(52) U.S. Cl. .................. 438/479; 438/162; 438/478; 438/481; 257/E21.09

(58) Field of Classification Search .............. 257/347, 257/E21.09; 438/479, 404, 162, 478, 481
See application file for complete search history.

(56) References Cited

U.S. PATENT DOCUMENTS

| | | | |
|---|---|---|---|
| 6,217,647 B1 * | 4/2001 | Laermer et al. | 117/4 |
| 2002/0115240 A1 * | 8/2002 | Assaderaghi et al. | 438/149 |
| 2003/0139023 A1 * | 7/2003 | Fogel et al. | 438/480 |
| 2005/0056352 A1 * | 3/2005 | Bedell et al. | 148/537 |
| 2005/0067294 A1 | 3/2005 | Choe et al. | |
| 2005/0170570 A1 * | 8/2005 | DeSouza et al. | 438/162 |
| 2005/0277260 A1 * | 12/2005 | Cohen et al. | 438/387 |
| 2006/0003555 A1 * | 1/2006 | Adam et al. | 438/479 |
| 2006/0105559 A1 * | 5/2006 | Chen et al. | 438/607 |

* cited by examiner

*Primary Examiner*—Thanh V Pham
*Assistant Examiner*—Duy T Nguyen
(74) *Attorney, Agent, or Firm*—H. Daniel Schnurmann; Daryl K. Neff

(57) ABSTRACT

A method is provided for making a silicon-on-insulator substrate. Such method can include epitaxially growing a highly p-type doped silicon-containing layer onto a major surface of an underlying semiconductor region of a substrate. Subsequently, a non-highly p-type doped silicon-containing layer may be epitaxially grown onto a major surface of the p-type highly-doped epitaxial layer to cover the highly p-type doped epitaxial layer. The overlying non-highly p-type doped epitaxial layer can have a dopant concentration substantially lower than the dopant concentration of the highly p-type doped epitaxial layer. The substrate can then be processed to form a buried oxide layer selectively by oxidizing at least portions of the highly p-type doped epitaxial layer covered by the non-highly p-type doped epitaxial layer, the buried oxide layer separating the overlying monocrystalline semiconductor layer from the underlying semiconductor region. Such processing can be performed while simultaneously annealing the non-highly p-type doped epitaxial layer.

9 Claims, 3 Drawing Sheets

FORMATION OF SOI BY OXIDATION OF SILICON WITH ENGINEERED POROSITY GRADIENT

BACKGROUND OF THE INVENTION

1. Technical Field

The present invention relates generally to semiconductor devices, and more particularly to a silicon-on-insulator substrate and a method for fabricating a silicon-on-insulator substrate.

2. Description of the Related Art

Silicon-on-insulator ("SOI") wafers are a basic material for use in the fabrication of advanced complementary metal oxide semiconductor ("CMOS") circuits. An SOI wafer typically includes a relatively thin monocrystalline layer of silicon exposed at an external major surface of the wafer, a bulk semiconductor region typically consisting essentially of silicon underlying the monocrystalline silicon layer, and a buried oxide (BOX) layer separating the monocrystalline layer from the bulk semiconductor region. The buried oxide layer typically has a thickness of less or about 150 nanometers (nm) and consists essentially of amorphous silicon dioxide.

The separation or isolation of the overlying monocrystalline semiconductor device layer (the "silicon-on-insulator" or "SOI" overlayer) from the underlying bulk semiconductor region of the substrate can result in significant benefits and performance improvements including, for example, less junction capacitance and leakage; greater resistance to ionizing radiation, electrical noise and heat; immunity to CMOS latch-up; and etc. However, forming SOI structures is no simple matter.

Two major processes presently employed for the industrial fabrication of SOI wafers are separation by implanted oxygen ("SIMOX") and wafer bond and layer transfer. While producing SOI wafers of excellent quality, both of these processes are still relatively costly. In the early 1980's, a process was proposed for making SOI by oxidation of a porous silicon (P—Si) layer below an overlying monocrystalline n-type silicon layer. This method, called fully isolation with porous oxidized silicon ("FIPOS"), required openings to be patterned in the overlying n-type monocrystalline silicon layer to provide access of the electrolyte to the underlying p-type layer. The need for pre-patterning made the FIPOS method unwieldy and expensive. United States Patent Publication No. 2005/0067294A1 to Choe et al. ("Choe et al.") describes a method of fabricating an SOI wafer via oxidation of a P—Si structure with a depth dependent porosity distribution. In order to create the desired depth distribution of porosity it is first created a depth distribution of p-type doping via implantation of boron ions followed by a thermal annealing for electrical activation of the implanted dopant atoms. Because the doping is made by ion implantation, the boron dopant concentration varies with the depth from the exposed surface according to an nearly Gaussian distribution, increasing from the exposed surface up to a maximum at the projected range of the implantation distribution and then decreasing continuously toward deeper depths. A subsequent anodization process renders the implanted layer porous with a porosity that varies with depth from the exposed surface of the SOI wafer. The layer becomes most porous in portions where the boron dopant concentration peaks. The porosity gradually reduces as the dopant concentration falls lower in regions away from the peak concentration, towards the surface and towards the bulk semiconductor region. A subsequent oxidation process converts the most heavily-doped portions of the substrate into a buried oxide ("BOX") layer. An implanted portion of the substrate which is not heavily-doped and which lies above the most heavily-doped portion becomes the overlying monocrystalline silicon region above the BOX layer. Another implanted portion which is not heavily-doped and which lies below the most heavily-doped portion becomes a portion of the bulk semiconductor region below the BOX layer.

However the process proposed in Choe et al. can not provide tight control over the BOX layer and SOI thicknesses. This is because the transition from the low porosity to high porosity regions occurs gradually along the depth in consequence of the Gaussian like implant boron doping profile in which the range straggling is tenths of the projected range. Furthermore, the gradual variation in porosity within the buried porous silicon layer makes it difficult to form a BOX layer that has a thickness of less than 100 nanometers (nm).

Forming SOI wafers having a plurality of internal buried oxide layers is also expensive and difficult by bond and etchback or bond and layer transfer methods, because the methods have to be applied at least twice during processing. To do so by an implantation of oxygen method can also be extremely difficult or even impossible because of the difficulty in controlling the depth of implanted ions to within a relatively narrow range of depths for forming each buried oxide layer.

SUMMARY OF THE INVENTION

According to an aspect of the invention, a method is provided for making a silicon-on-insulator substrate. Such method can include epitaxially growing a highly p-type doped silicon-containing layer onto a major surface of an underlying semiconductor region of a substrate. Subsequently, a non-highly p-type doped silicon-containing layer may be epitaxially grown onto a major surface of the highly p-type doped epitaxial layer to cover the highly p-type doped epitaxial layer. The overlying non-highly p-type doped epitaxial layer can have a dopant concentration substantially lower than the dopant concentration of the highly p-type doped epitaxial layer. An in situ doping method may be used to establish a dopant concentration of the highly-doped layer when epitaxially growing such layer. A p-type dopant such as boron, aluminum, gallium, indium or thallium, for example, can be used as a dopant in forming such epitaxial layers. An epitaxial growth method can allow sharp transitions to be achieved between low and high doping levels. Transitions between such doping levels can be made to occur within distances of as little as a few atomic planes in a crystalline semiconductor. The anodization of such a layered epitaxially grown material results in P—Si material which can have sharp transitions from low porosity to high porosity regions. The substrate can then be processed to create a buried oxide ("BOX") and a silicon-on-insulator layer ("SOI") by thermal treatment in an oxidizing atmosphere. In such way, in regions of high porosity, silicon atoms can be completely oxidized to form a silicon dioxide layer. In other regions where the porosity is low, the silicon atoms can be converted to a monocrystalline silicon layer epitaxially registered with the crystal of the underlying bulk semiconductor region. In accordance with another aspect of the invention, an SOI substrate is provided which includes a silicon-containing monocrystalline semiconductor layer separated from an underlying semiconductor region by a BOX layer having a thickness less than or equal to about 10 nanometers, the BOX layer having a surface roughness with a root mean square roughness of less than about 0.5 nanometer.

DETAILED DESCRIPTION

A feature of a method of fabrication described in accordance with an embodiment of the invention illustrated in FIGS. 1-6 is epitaxial growth of a series of monocrystalline semiconductor layers having differing p-type dopant concentrations which can be established by an in situ doping method. Unlike the ion implantation process described above in Choe et al. as background herein, an in situ doping method establishes a dopant concentration in a semiconductor layer by controlling a concentration of a dopant material present in a chamber while epitaxially growing the semiconductor layer. The epitaxial layer growth method permits creation of layers each having uniform dopant concentration with sharp transition to the adjacent layers of different dopant concentrations. Thus, in an embodiment of the invention herein, a series of vertically stacked epitaxial semiconductor layers can be doped to different p-type dopant concentrations by controlling concentrations of dopant material present in a processing chamber when the series of epitaxial semiconductor layers are grown.

Figure 1:
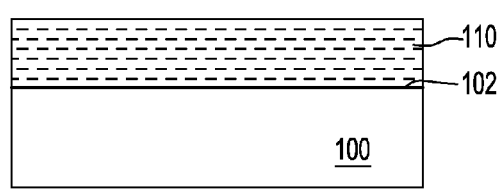
FIG. 1 is a sectional view illustrating a stage in a method of fabricating a silicon-on-insulator substrate in accordance with an embodiment of the invention.

FIG. 1 is a sectional view illustrating a stage in a method of fabricating a silicon-on-insulator ("SOI") substrate in accordance with an embodiment. As used herein, "silicon-on-insulator substrate" refers to a structure in which an active semiconductor region containing monocrystalline semiconductor material such as silicon or an alloy of silicon with another semiconductor material, such as for example, silicon germanium ("SiGe"), silicon carbon ("SiC") overlies a bulk semiconductor region of a substrate and is separated from the bulk semiconductor region of the substrate by a buried oxide ("BOX") layer. Once the SOI substrate is fully formed, active semiconductor devices, such as transistors or diodes, for example, can have portions fabricated in the active semiconductor region.

FIG. 1 illustrates a stage of fabrication in which an epitaxial layer 110 of semiconductor material is grown overlying a major surface 102 of an underlying monocrystalline semiconductor region 100 of a substrate. The underlying monocrystalline semiconductor region 100 typically is a bulk semiconductor region of a semiconductor substrate. Alternatively, the underlying monocrystalline semiconductor region can be a monocrystalline semiconductor region of a substrate other than a bulk semiconductor region. The underlying semiconductor region 100 can have a dopant type, i.e., n-type or p-type, and concentration, e.g., $n^-$, $n$, $n^+$, $p^-$, $p$ or $p+$, such as may be selected to be compatible with the fabrication of semiconductor devices in the SOI substrate to be completed by the method of fabrication. The epitaxial layer 110 can be in situ doped. A dopant concentration in epitaxial layer 110 can be established by controlling the concentration of a dopant in a chamber in which the epitaxial layer is grown on the underlying semiconductor region. In a particular embodiment, the underlying semiconductor region has a p-type dopant type and concentration; i.e., a dopant concentration of a p-type dopant (e.g., boron) in a range of $1\times10^{14}$ cm$^{-3}$ to $5\times10^{18}$ cm$^{-3}$.

Figure 2:
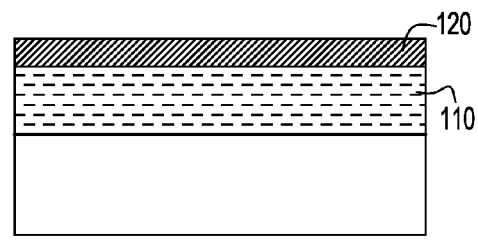
FIG. 2 is a sectional view illustrating a stage in a method of fabricating a silicon-on-insulator substrate subsequent to the stage depicted in FIG. 1.

Subsequently, as illustrated in FIG. 2, a highly-doped monocrystalline epitaxial semiconductor layer 120 is grown overlying epitaxial layer 110, the highly doped epitaxial layer having a $p^+$ dopant concentration ranging from about $1\times10^{19}$ cm$^{-3}$ to $2\times10^{20}$ cm$^{-3}$. Like layer 110, a dopant concentration in epitaxial layer 120 typically is established by in situ doping conducted during the epitaxial growth of the layer 120.

Figure 3:
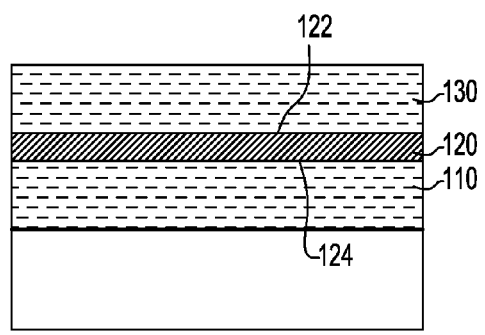
FIG. 3 is a sectional view illustrating a stage in a method of fabricating a silicon-on-insulator substrate subsequent to the stage depicted in FIG. 2.

Subsequently, as illustrated in FIG. 3 a non-highly doped monocrystalline epitaxial layer 130 having a p type dopant concentration ranging from about $1\times10^{14}$ cm$^{-3}$ to $5\times10^{18}$ cm$^{-3}$ is grown overlying the second epitaxial layer 120. Like layer 110 and layer 120, a dopant concentration in epitaxial layer 130 typically is established by in situ doping conducted during the epitaxial growth of the layer 130.

Figure 4:
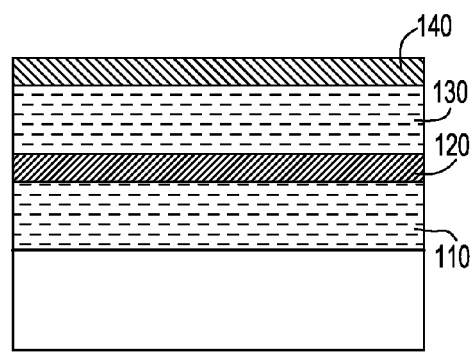
FIG. 4 is a sectional view illustrating a stage in a method of fabricating a silicon-on-insulator substrate subsequent to the stage depicted in FIG. 3.
Figure 5:
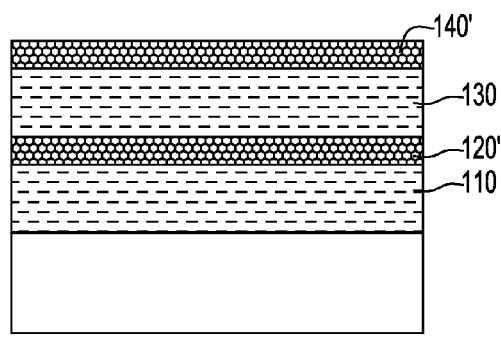
FIG. 5 is a sectional view illustrating a stage in a method of fabricating a silicon-on-insulator substrate subsequent to the stage depicted in FIG. 4.

As further shown in FIG. 4, a heavily doped monocrystalline epitaxial layer 140 having a $p^{++}$ dopant concentration typically greater than about $1\times10^{20}$ cm$^{-3}$ is grown overlying the p doped epitaxial layer 130. The epitaxial layer 140 can be grown by an epitaxial process from a major surface 132 of the underlying epitaxial layer 130. The heavily doped monocrystalline epitaxial layer 140 typically is established by in situ doping conducted during the epitaxial growth of the layer 140. Layer 140 is optionally formed as a sacrificial layer which will be removed by subsequent processing. Layer 140 may not need to be as thick as layer 120 when it is a sacrificial oxide layer. Without limitation, in one example, layer 140 has a thickness ranging from about 3 nanometers to about 20 nanometers.

In particular embodiments, other p-type dopants can be used in addition to or instead of boron during growth of the in situ doped epitaxial semiconductor layers, such as aluminum, gallium, indium or thallium, for example. Moreover, it is not necessary that the same p-type dopant be used as the sole dopant during the in situ epitaxial growth process. For example, a particular p-type dopant can be used while epitaxially growing one layer of the structure and a different p-type dopant can be used while epitaxially growing another layer of the structure. In addition, more than one p-type dopant can be provided in respective concentrations to a processing chamber when growing a particular epitaxial layer to establish the dopant concentration in such layer of the structure. A different combination of p-type dopants or concentrations of such dopants can be provided to the processing chamber when growing another epitaxial layer of the structure.

After growing the series of epitaxial layers 110, 120, 130 and optional epitaxial layer 140 as shown in FIG. 4, an anodization process now is performed in a hydrofluoric acid (HF) containing electrolyte solution to convert layers 110, 120, 130 and 140 in a porous silicon material, in which the porosity scales with the dopant concentration in the layers. As a result, $p^+$ semiconductor regions 120' and 140' are converted to P—Si with a coarse porous structure, giving the semiconductor layers 120 and 140 a sponge-like appearance. On the other hand, non-highly p doped regions 110 and 130 are converted to P—Si with a fine porous structure.

Porous Si can be formed by electrolytic anodization in a solution containing HF. An HF-resistant electrode, such as one made of platinum, is biased negatively, and the Si substrate is biased positively. The porosity, measured in terms of the mass loss, of the resulting porous Si layer formed in the surface of a Si wafer is proportional to the electrical current density and inversely proportional to the HF concentration. The depth of a porous Si layer formed within a region of silicon can be proportional to the anodization time for a given dopant concentration and current density. The actual structure of the porous Si, however, is a very complicated function of the type and concentration of dopants and defects, in addition to the above-mentioned parameters. A common characteristic of porous Si materials is the enormous surface area associated with high-density pores: The surface area per unit volume is estimated to be 100-200 $m^2cm^3$, i.e., 100-200 square meters of surface area per each cubic centimeter in volume. The presence of this large surface area makes porous Si very susceptible to chemical reaction with an ambient gas such as oxygen. The oxidation rate of porous Si is found to be an order of magnitude higher than that of bulk Si. This makes porous Si a good candidate for oxide isolation.

In an example of an anodization process, anodization can be performed at room temperature or below room temperature in the dark, or with exposure to light by immersing the substrate with the series of epitaxial layers thereon in an electrolyte formed by hydrogen fluoride (HF) (which can be used from a typical commercial solution at a weight concentration of 49%, for example. The electrolyte can be prepared by dilution of the commercial HF solution in water to a lower concentration). The substrate (anode) is then connected to the positive electrode (anode) of a voltage source in order to hold the substrate at a constant potential and another electrode (cathode) of the voltage source is immersed in the electrolyte, the cathode typically including a material which is resistant to HF, such as platinum (Pt) or graphite, for example. Alternatively, the electrolyte can have a different composition, such as a mixture of HF with water, alcohol or ethylene glycol, for example, which can have a range of concentrations.

In one embodiment, the anodization process can be implemented by a constant current process at room temperature or below room temperature in HF at concentration of 49% in weight. Current density during anodization can range from one to 20 milliamperes per centimeter squared ($mAcm^{-2}$). Typically anodization times can range between about 10 seconds and 100 seconds. The amount of time required to perform the anodization depends upon a variety of factors, such as the dopant concentration within the semiconductor layers 110, 120, 130 and 140, the thickness of the layers and the current density selected to perform the anodization. The highly doped $p^{++}$ epitaxial layer 140 helps avoiding formation of etch pits during anodization of the epitaxially layered structure. Such pits can consume a part of the vertical height of the epitaxial layer 130 and result in structural imperfections in the SOI layer to be formed after the subsequent thermal treatment.

Following anodization, further processing is performed to oxidize the porous layers 120, 140 to form layers of oxide in their place. eliminating the fine porous in the layers 110 and 130 to renders them single crystalline silicon with its natural density. The substrate may also be held at a high temperature for a number of hours in order to "anneal" the substrate, i.e., such as for the purpose of producing layers 110 and 130 high quality monocrystalline silicon layers, healing crystal defects in the epitaxial layers 110, 130 and the underlying substrate 100. The annealing process may also improve the density and other characteristics, e.g., dielectric strength of the oxide layers 120' and 140'.

In one example, when an epitaxial semiconductor layer 120 having a thickness of about 50 nanometers is to be formed, the porous layers can be formed by anodization of the p-type doped epitaxial layers 110, 120, 130, 140 (FIG. 4) in HF having a concentration of about 49% by weight. In such anodization step, a current density of 2.5 $mAcm^{-2}$ can be used for a period of time, such as 30 seconds, for example. Thereafter, the oxidation step can be performed by maintaining the substrate in a chamber containing dry oxygen (e.g., $O_2$ with at least essentially no moisture present) at a temperature such as 1000° Celsius for about three hours. Subsequently, the substrate can be annealed by maintaining the substrate in an inert ambient in a chamber at 1320° Celsius for five hours.

Figure 6:
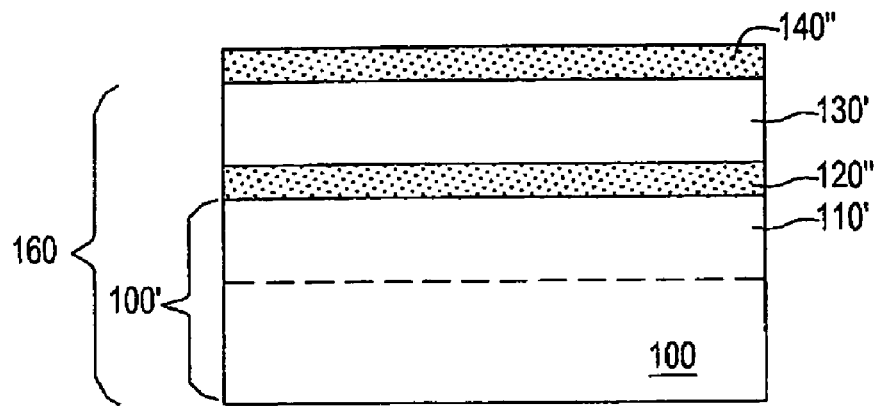
FIG. 6 is a sectional view illustrating a silicon-on-insulator substrate in accordance with an embodiment of the invention.

FIG. 6 is a sectional view illustrating the substrate 160 following the anodization step and subsequent oxidation and annealing steps. Oxide layers 120" and 140" are now present in place of coarse porous layers 120', 140' (FIG. 5), respectively. Buried oxide ("BOX") layer 120" is a high quality layer of dense semiconductor oxide material such as silicon dioxide. The BOX layer 120" provides electrical isolation between an upper monocrystalline semiconductor layer 130' and underlying semiconductor regions. Specifically, the BOX layer 120" separates an upper monocrystalline semiconductor region 130' from the bulk semiconductor region, that is, semiconductor region 100' which includes the original bulk semiconductor region 100 (FIG. 1) and an adjacent monocrystalline semiconductor region 110' where epitaxial semiconductor region 110 (FIG. 1) was formed.

The exposed oxide layer 140" may now be removed, this layer having served a purpose as a sacrificial layer to protect the underlying monocrystalline semiconductor layer 130" during the anodization and oxidation steps. However, if left in place following the annealing step, the exposed oxide layer 140" may serve as a sacrificial layer, e.g., a masking layer or pad oxide layer during subsequent steps for patterning features within or above semiconductor layer 130'.

Figure 7:
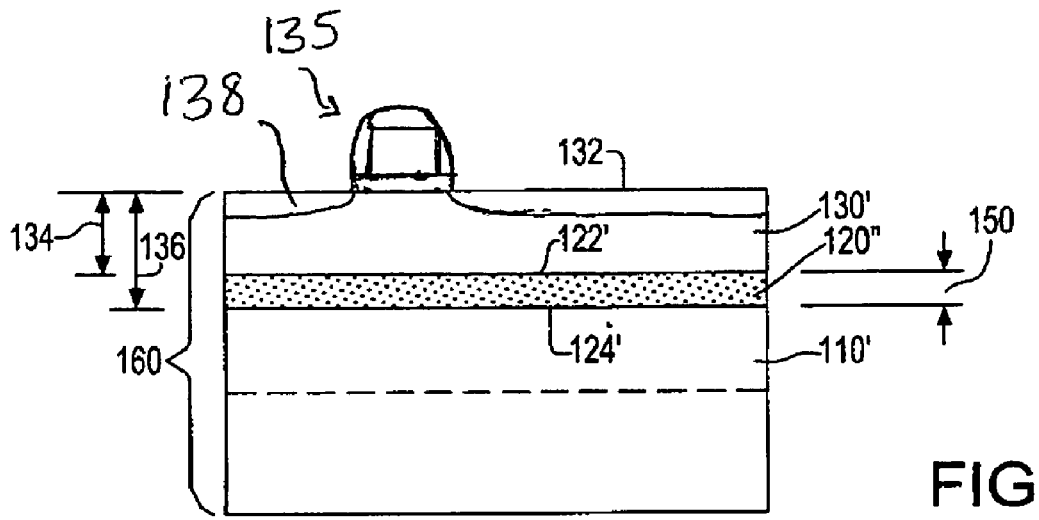
FIG. 7 is a sectional view illustrating a silicon-on-insulator substrate in accordance with an alternative embodiment of the invention.

The resulting substrate 160 (FIG. 7) is a semiconductor-on-insulator substrate 160 having a high quality BOX layer 120" with upper and lower major surfaces 122', 124' which are well-controlled in distance 134, 136, respectively, from the exposed major surface 132 of the monocrystalline semiconductor layer 130'. The thickness of the monocrystalline semiconductor layer 130' that results is slightly smaller than the thickness of the epitaxial semiconductor layer 130, since a fraction of the mass was removed for the formation of its fine porous structure. Using the techniques described herein, the monocrystalline semiconductor layer 130' can have a thickness ranging upwards from about 5 nanometers. Large thicknesses can be achieved as well, such that a semiconductor layer 130' having a thickness of 200 nanometers or more can be achieved. Semiconductor devices 135 can be formed in the overlying monocrystalline semiconductor layer 130' which have a semiconductor region or "active region" 138 disposed within layer 130', such layer being electrically isolated from the underlying semiconductor region 100'.

The thickness 150 of the BOX layer 120" can also be controlled very well. Using the techniques described herein, the BOX layer 120" can have a thickness ranging upwardly from about 10 nanometers. Large thicknesses are achievable by the techniques described herein, such that a BOX layer 120" having a thickness of 200 nanometers or more can be achieved. The thickness of the final BOX layer 120" is determined primarily by the thickness of the highly doped semiconductor layer 120 (FIG. 3) prior to being made porous. The thickness of the final BOX layer 120" is also determined in part by the density of the porous semiconductor layer 120' (FIG. 5) from which it is formed by oxidation. Semiconductor oxide material, e.g., silicon dioxide, formed by oxidizing semiconductor material such as silicon, occupies a greater volume than the volume occupied by pure semiconductor material, since in each molecule of the semiconductor oxide material two oxygen atoms join each silicon atom of the original semiconductor material. Therefore, a layer of semiconductor material of normal density expands during oxidation to a greater volume and becomes a thicker oxide layer than the initial semiconductor layer. However, when the semiconductor material begins as a relatively porous layer, the expansion during oxidation occurs internally within the voids of the porous semiconductor layer, such that the thickness of the semiconductor oxide layer may not be much greater than the thickness of the initial semiconductor layer. In fact, the thickness of the semiconductor oxide layer may be the same as or less than the thickness of the initial semiconductor layer.

The volume occupied by pure silicon dioxide is greater than the volume occupied by pure silicon by a ratio of 2.25:1. Thus, when the proportion of silicon that remains within each porous silicon region is greater than 1/2.25 (i.e., the remaining silicon mass within the volume of the porous silicon region is greater than about 44% of the original mass), the resulting silicon dioxide expands. Another way that this can be stated is the following: the resulting silicon dioxide expands to occupy a larger volume than an original layer of silicon when porosity is less than 56%, that is, when the amount of mass removed from the defined volume of the porous silicon region is less than 56% of the starting mass. In general, the degree of porosity is higher when the boron concentration is higher, and the degree of porosity is lower when the boron concentration is lower. Also, in general, higher porosity can be achieved when the current density of the anodization process is higher. Conversely, lower porosity is achieved when the current density is lower.

As the upper and lower boundaries 122', 124' of the highly doped semiconductor region (FIG. 3) are generally better controlled than, i.e., generally sharper than those which can defined by implantation over the surface of a wafer, the depths 134, 136 of the major surfaces 122', 124' of the buried oxide ("BOX") layer 120" (FIG. 7) below the exposed major surface 132 of layer 130' are also controlled well. Moreover, the major surfaces 122', 124' of the BOX layer 120" have surface roughness that compares to that of a BOX layer 120" formed by implantation of oxygen and annealing. Thus, the major surfaces 122', 124' of the BOX layer 120" (FIG. 7) can have a root mean square surface roughness of as little as one nanometer or less. The amplitude of the roughness of the BOX layer can be less than 3.5 nanometers. With appropriate process control, the surface roughness can reach a root mean square value of 0.40 nanometers.

The more precise control over the locations of the surfaces 122', 124' of the BOX layer allows processing tolerances for the thickness of the BOX layer 120" to be tightened. With the thickness 150 of the BOX layer 120" more precisely controlled, the nominal thickness of the BOX layer can be reduced. Thus, in one embodiment, the thickness 150 of the BOX layer 120" can be as little as 10 nanometers or less. The distance separating the overlying monocrystalline semiconductor layer 130' from the underlying semiconductor region 100' (FIG. 6) can be controlled to 10 nanometers or less.

However, the relatively small thickness of the BOX layer does not impact the dielectric strength of the BOX layer. Given a BOX layer thickness of 50 nanometers or less, the high quality of the BOX layer makes it possible to attain a dielectric strength of at least one megavolt per centimeter ($MVcm^{-1}$). When the fabrication process is appropriately controlled, a dielectric strength of greater than eight megavolts per centimeter can be achieved and reduce the density of electrical shorts between the SOI layer and the underlying semiconductor region 100 across the BOX layer to less than about 5 $cm^{-2}$ or even less than 2 $cm^{-2}$, despite the BOX layer being thin at less than or equal to about 50 nanometers in thickness.

In the foregoing described embodiment, the epitaxial layer 110 (FIG. 4) may be used as a buffer layer between the bulk semiconductor region 100 and the highly doped epitaxial layer 120 directly adjacent thereto, if the dopant concentration in the bulk region 100 is relatively high. In this case, optionally the dopant concentration of the epitaxial layer 110 may be between about $1\times10^{14}$ $cm^{-3}$ and $5\times10^{18}$ $cm^{-3}$. In an alternative embodiment of the invention, optionally the processing to form epitaxial layer 110 may be omitted when the p-dopant concentration in the bulk semiconductor region is below $5\times10^{18}$ $cm^{-3}$. Layer 110 can be omitted also when the substrate 100 is n-type.

Figure 9:
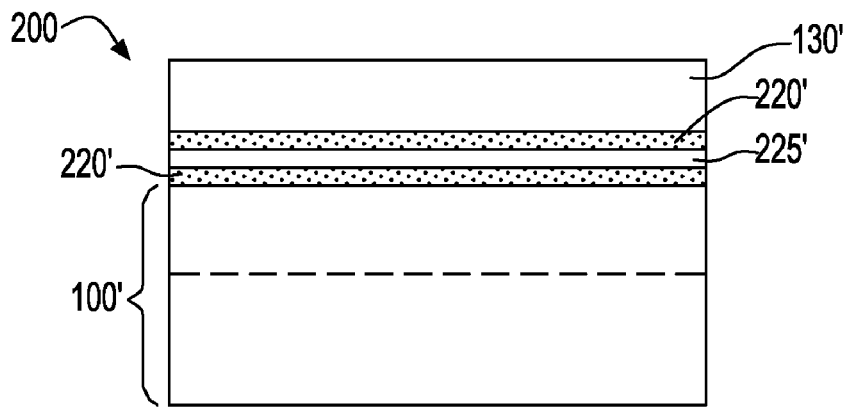
FIG. 9 is a sectional view illustrating a silicon-on-insulator substrate in accordance with an alternative embodiment of the invention.

The above-described techniques can also be applied to the formation of an SOI substrate 200 as illustrated in FIG. 9 which includes a plurality of relatively thin BOX layers 220' which can be separated by one or more intervening layers 225' of monocrystalline semiconductor material. The plurality of thin BOX layers 220' separate the overlying monocrystalline semiconductor region 130' from the underlying semiconductor region 100'. As in the foregoing example (FIG. 7), semiconductor devices can be formed in the overlying monocrystalline semiconductor layer 130' which are electrically isolated from the underlying semiconductor region 100'.

Figure 8:
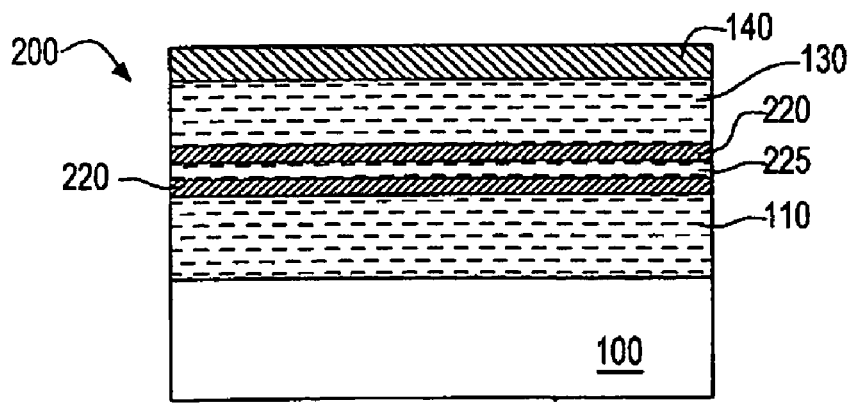
FIG. 8 is a sectional view illustrating a stage in a method of fabricating a silicon-on-insulator substrate in accordance with an alternative embodiment of the invention.

FIG. 8 illustrates a preliminary stage in the formation of the SOI substrate 200 (FIG. 9) in accordance with an embodiment of the invention. FIG. 8 illustrates a stage of fabrication in which a series of epitaxial semiconductor layers have been grown overlying a bulk semiconductor region 100 of a substrate. Similar to the method described above, a non-highly doped p-type epitaxial monocrystalline semiconductor layer 110 is grown overlying a bulk semiconductor region 100. Layer 110 may have a p dopant concentration of $1\times10^{14}$ $cm^{-3}$ to $5\times10^{18} cm^{-3}$, for example. Subsequently, a first highly doped epitaxial monocrystalline semiconductor layer 220 is grown in which the dopant concentration is established by in situ doping, such layer 220 having a dopant concentration of $1\times10^{19}$ $cm^{-3}$ to $2\times10^{20}$ $cm^3$, for example. Layer 220 can be rather thin, having a thickness optionally less than 50 nanometers. In one embodiment, the thickness of layer 220 can be 20 nanometers or less and may be only 10 nanometers.

Subsequently, an intermediate non-highly doped monocrystalline semiconductor layer 225 is grown epitaxially overlying the first highly doped semiconductor layer, such layer being p doped (having a dopant concentration of about $1\times10^{14}$ $cm^{-3}$ to $5\times10^{18}$ $cm^{-3}$). In one embodiment, the intermediate layer 225 may be rather thin, having a thickness which can be 20 nanometers or less and may be only 10 nanometers.

Subsequently, a second first highly doped epitaxial monocrystalline semiconductor layer 220 is grown in which the dopant concentration is established by in situ doping, the second layer 220 having a dopant concentration of $1\times10^{19}$ cm$^{-3}$ to $2\times10^{20}$ cm$^{-3}$, for example. Again, the second layer 220 can be rather thin. In one embodiment, the second layer can have a thickness of less than 20 nanometers and may have a thickness of only 10 nanometers.

Subsequently, the overlying p doped monocrystalline semiconductor layer 130 and highly doped p$^{++}$ monocrystalline semiconductor region 140 are epitaxially grown, as in the embodiment described above with respect to FIGS. 3 and 4. When the substrate 200 (FIG. 8) is then processed, i.e. anodized, oxidized and annealed via the processes described above (FIGS. 5 and 6) and an overlying oxide layer 140'' (FIG. 6) is removed, the resulting substrate 200 appears as shown in FIG. 9.

Figure 10:
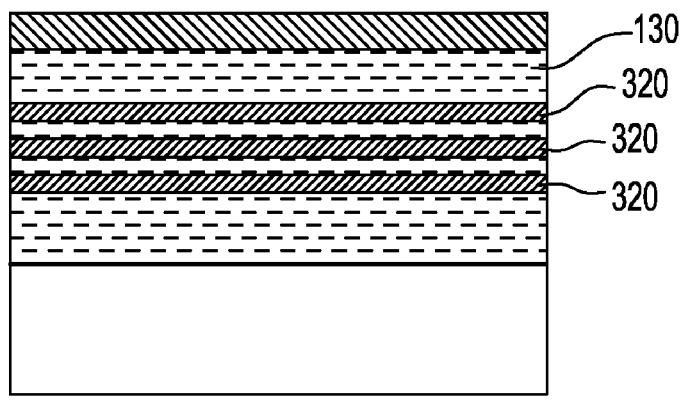
FIG. 10 is a sectional view illustrating a stage in a method of fabricating a silicon-on-insulator substrate in accordance with an alternative embodiment of the invention.
Figure 11:
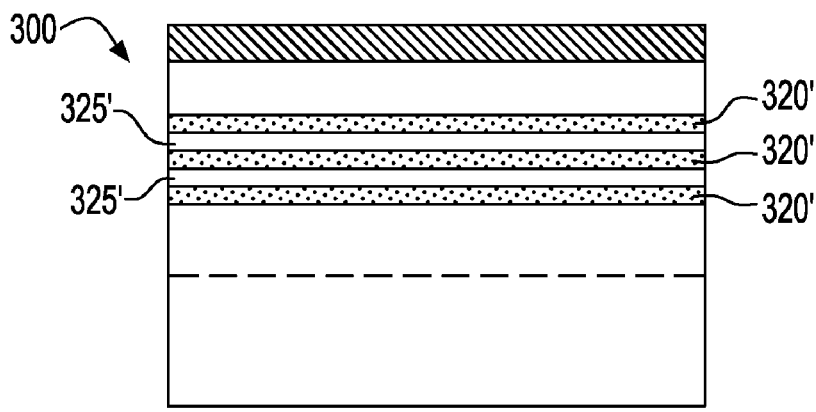
FIG. 11 is a sectional view illustrating a silicon-on-insulator substrate in accordance with an alternative embodiment of the invention.

By the principles of the foregoing embodiments of the invention, it is evident that the number of BOX layers 320' of a substrate 300 (FIG. 11) need not be limited to two, but can be three, four or an even greater number. As illustrated in FIG. 11, each of a series of three BOX layers 320' can be spaced apart from an adjacent one of the BOX layers 320' by an intermediate monocrystalline semiconductor layer 325'. In this case, the substrate 300 is fabricated in a manner similar to that described above with reference to FIGS. 8 and 9, except that a greater number of highly doped epitaxial semiconductor layers 320 (FIG. 10) are grown prior to growing the final non-highly doped semiconductor layer 130.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of making a silicon-on-insulator substrate, comprising:
    a) epitaxially growing a first highly doped silicon-containing layer onto a major surface of an underlying semiconductor region of a substrate, the first highly-doped epitaxial layer having a p-type dopant concentration greater than about $5\times10^{18}$ cm$^{-3}$ and substantially higher than the p-type dopant concentration of the underlying semiconductor region;
    b) epitaxially growing a non-highly doped p-type silicon-containing layer onto a major surface of the first highly-doped epitaxial layer to cover the first highly doped epitaxial layer, the non-highly doped epitaxial layer having a dopant concentration substantially lower than the dopant concentration of the first highly-doped epitaxial layer;
    c) epitaxially growing a second highly-doped epitaxial layer overlying the non-highly doped epitaxial layer, the second highly-doped epitaxial layer having a p-type dopant concentration greater than about $5\times10^{18}$ cm$^{-3}$ and substantially higher than the dopant concentration of the non-highly doped epitaxial layer;
    d) with a major surface of the second highly-doped epitaxial layer fully exposed, subjecting the substrate with the layers thereon to anodization to selectively form first and second coarse porous silicon-containing layers from the first and second highly-doped epitaxial layers and a fine porous silicon-containing layer from the non-highly doped layer;
    e) subjecting the substrate with the layers thereon to oxidation to oxidize the first and second coarse porous silicon-containing layers, and then annealing the substrate with the layers thereon to form a buried oxide layer from the first coarse porous silicon-containing layer, a monocrystalline semiconductor layer from the fine porous silicon-containing layer, the monocrystalline semiconductor layer overlying the buried oxide layer, and an overlying oxide layer from the second coarse porous silicon-containing layer, the overlying oxide layer having a fully exposed major surface; and
    f) then removing the overlying oxide layer to expose the monocrystalline semiconductor layer.

2. A method as claimed in claim 1, wherein a thickness of the buried oxide layer is substantially the same as a thickness of the first highly-doped epitaxial layer.

3. A method of fabricating a semiconductor device comprising the method of making a silicon-on-insulator substrate as claimed in claim 1, further comprising:
    forming a semiconductor device having an active region disposed within the monocrystalline semiconductor layer.

4. A method as claimed in claim 3, wherein the semiconductor device includes at least one semiconductor region insulated from the underlying semiconductor region by the buried oxide layer, said buried oxide layer having upper and lower major surfaces which are well controlled in distance respectively from said monocrystalline semiconductor layer.

5. A method as claimed in claim 1, wherein the second highly-doped epitaxial layer protects the non-highly doped epitaxial layer from pitting during the anodization process in step (d) and improves defect density in the monocrystalline semiconductor layer which results from the non-highly doped epitaxial layer.

6. A method as claimed in claim 1, wherein the monocrystalline semiconductor layer is spaced from the underlying semiconductor region by the thickness of the buried oxide layer.

7. A method as claimed in claim 1, wherein the monocrystalline semiconductor layer is spaced from the underlying semiconductor region by a distance less than or equal to about 10 nanometers.

8. A method as claimed in claim 1, further comprising prior to step (c) epitaxially growing a third highly-doped epitaxial layer on the non-highly doped epitaxial layer, and epitaxially growing a second non-highly doped epitaxial layer on the third highly-doped epitaxial layer, wherein steps (d) and (e) form a second buried oxide layer from the third highly-doped epitaxial layer and form a second monocrystalline semiconductor layer from the second non-highly doped epitaxial layer.

9. A method as claimed in claim 8, wherein the thickness of each of the first and second buried oxide layers is less than 20 nanometers and the first and second buried oxide layers cooperate together as a buried insulator element separating the second monocrystalline semiconductor layer from the bulk semiconductor layer and said second monocrystalline semiconductor layer having a thickness at least slightly smaller than a thickness of said second non-highly-doped epitaxial semiconductor layer from which it is formed.

* * * * *